US008674418B2

(12) United States Patent
Poddar et al.

(10) Patent No.: US 8,674,418 B2

(45) Date of Patent: Mar. 18, 2014

(54) METHOD AND APPARATUS FOR ACHIEVING GALVANIC ISOLATION IN PACKAGE HAVING INTEGRAL ISOLATION MEDIUM

(75) Inventors: Anindya Poddar, Sunnyvale, CA (US); Vijaylaxmi Khanolkar, Santa Clara, CA (US); Ashok S. Prabhu, San Jose, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 287 days.

(21) Appl. No.: 13/214,069

(22) Filed: Aug. 19, 2011

(65) Prior Publication Data

US 2013/0043970 A1 Feb. 21, 2013

(51) Int. Cl.

*H01L 31/062* (2012.01)
*H01L 21/70* (2006.01)
*H01L 23/552* (2006.01)

(52) U.S. Cl.

USPC ............................ 257/294; 257/508; 257/659

(58) Field of Classification Search

None

See application file for complete search history.

(56) References Cited

U.S. PATENT DOCUMENTS

| | | | | |
|---|---|---|---|---|
| 6,147,393 | A * | 11/2000 | Zommer | 257/501 |
| 8,466,535 | B2 * | 6/2013 | Hopper et al. | 257/529 |
| 2007/0188288 | A1 * | 8/2007 | Ishii | 336/200 |
| 2012/0002377 | A1 * | 1/2012 | French et al. | 361/748 |
| 2013/0001735 | A1 * | 1/2013 | Hopper et al. | 257/499 |
| 2013/0037908 | A1 * | 2/2013 | Hopper et al. | 257/529 |
| 2013/0037909 | A1 * | 2/2013 | French et al. | 257/532 |

FOREIGN PATENT DOCUMENTS

JP 06-251995 * 9/1994

* cited by examiner

*Primary Examiner* — James Mitchell

(74) *Attorney, Agent, or Firm* — Eugene C. Conser; Wade J. Brady, III; Frederick J. Telecky, Jr.

(57) ABSTRACT

An inductor device having an improved galvanic isolation layer arranged between a pair of coil and methods of its construction are described.

15 Claims, 10 Drawing Sheets

METHOD AND APPARATUS FOR ACHIEVING GALVANIC ISOLATION IN PACKAGE HAVING INTEGRAL ISOLATION MEDIUM

TECHNICAL FIELD

The present invention relates generally to packages requiring a high level of galvanic isolation. In particular, the invention refers to semiconductor device packages with particular applicability to devices requiring galvanic isolation. Examples include capacitive circuitry, inductive circuitry (used, for example, in power converter devices), as well as many other devices and implementations where a high degree of galvanic isolation and resistance to adverse environmental conditions is advantageous. Also, the invention relates to methods of construction and packaging of these packages.

BACKGROUND OF THE INVENTION

In the field of electronic and computer devices, there is a need for electrically isolating electrical devices and circuit elements from one another in a manner such that enables electrical isolation between the two elements but still enables information, signal, or energy to be transmitted between the circuit elements. In one example, information can be transmitter between a pair of galvanically isolated coils. Additionally, such galvanic isolation can be used in conjunction with capacitive circuitry.

In one example, a prior art primary coil can be placed relatively closely to a secondary coil to achieve reasonably good enable a reasonable degree of inductive (electromagnetic) energy transmission and sufficient electrical isolation between the coils. The trade off is always distance yields improved galvanic isolation but at the cost of decreasing energy transmission between the primary and secondary coils.

What is needed is a galvanic isolation structure that provides good galvanic isolation and also enables very small distances between the associated circuit elements to enable good transmission of non-electrical energy between the associated circuit elements (in one example, between coil elements in an inductive circuit).

Moreover, existing solutions have a number of material and performance difficulties, cost issues, and fabrication issues resulting in increased fabrication costs, insufficient performance, and higher failure rates in the packages currently available.

Additionally, existing layouts present relatively large surface areas as well as packages and galvanic isolation structures where a thinner and smaller form factor would be desirable.

These limitations become increasingly problematic when faced with the decreasing size of consumer electronic devices. Accordingly, a need for devices (including inductive and capacitive circuitry) having a smaller "footprint" is desirable. The depicted prior art converter package 10 has a very large surface area.

Accordingly, as explained in this patent, an improved galvanic isolation substrate and associated package is an object of this invention as it an improved inductor element. It is one of the objects of this patent to provide such a package and modes for its manufacture.

SUMMARY OF THE INVENTION

In a first aspect, an embodiment of the invention describes an electrical device comprising a galvanic isolation medium arranged between a pair of electrical elements. In one aspect the device includes a galvanic isolation medium arranged on a base support wherein the galvanic isolation constant of the galvanic isolation medium is greater than the galvanic isolation constant of the base support. In particular, an aspect of the device is directed to an inductor device where the galvanic isolation medium is arranged between a pair of coils. Moreover, in an aspect, the galvanic isolation medium comprises a material like borosilicate glass material.

In another aspect, embodiments of the invention disclose an inductor device wherein shielding is arranged on either side of the galvanic isolation medium such that each coil is arranged between the galvanic isolation medium and the associated shielding.

In another aspect, embodiments of the invention are directed to an inductor device where the galvanic isolation medium is arranged between sets of primary coils and sets of secondary coils.

In another aspect, embodiments of the invention are directed to an inductor device having a spacer element mounted such that the spacer element supports the coils of the inductor in a spaced apart arrangement on either side of the galvanic isolation medium In another aspect, embodiments of the invention are directed to capacitive device having a galvanic isolation medium arranged between a pair of capacitor plates.

In another aspect, a method embodiment for forming an apparatus is disclosed. The method comprising the operations of forming a base substrate and forming a pair of electrical elements on an associated pair of substrates. Mounting the electrical elements and their associated pair of substrates on the base substrate such that a galvanic isolation medium is arranged between the pair of electrical elements. The method further involves using borosilicate glass as the galvanic isolation medium. The method further involves using pre-impregnated materials as the substrates. The method further involves mounting the pair of electrical elements in a spaced apart arrangement separated by a spacer as well as the galvanic isolation medium to form an embedded galvanic isolation medium.

In another aspect, a method for forming an inductor device comprises the operations of forming a base substrate, forming first set and a second set of coil elements and associated sets of substrates. Mounting the coils and associated substrates on the base substrate such that a galvanic isolation medium is arranged between the first set of coil elements and the second set of coil elements. The method further involves using arranging shields to provide electromagnetic field protection for the sets of coils.

In another aspect, a galvanic isolation stack having improved galvanic isolation properties is disclosed. Such a stack includes a base support and a galvanic isolation medium arranged on the base support such that the galvanic isolation constant of the isolation medium is greater than a galvanic isolation constant of the base support.

General aspects of the invention include, but are not limited to methods, systems, apparatus, and related products for enabling the fabrication of improved galvanic isolation substrates and improved inductor packages as well as other systems benefitting from improved galvanic isolation.

BRIEF DESCRIPTION OF THE DRAWINGS

The invention and the advantages thereof may best be understood by reference to the following description taken in conjunction with the accompanying drawings in which:

FIG. 1(*b*) is a diagrammatic plan view of a simplified inductor device.

FIG. 1(*c*) is a cross-section view of a simplified inductor device.

FIG. 1(*d*) is a side view of an embodiment of galvanic isolation stack in accordance with an aspect of the present invention.

FIG. 2(*b*) is a side section view of a coil and supplementary layer process used to integrate them with a galvanic isolation medium in accordance with the principles of the present invention.

FIG. 2(*c*) is a side section view of an integrated coil, supplementary layer, and galvanic isolation medium in accordance with an embodiment of the present invention.

FIG. 2(*d*) is a side section view of a simplified inductor device illustrating some example dimensions and other features of an embodiment of the present invention.

FIG. 3(*b*) is a plan view of a spacer embodiment used in inductor device using an embedded galvanic isolation medium in an embodiment of the present invention.

FIG. 3(*c*) is a side section view of a simplified inductor device with an embedded galvanic isolation medium in accordance with an embodiment of the present invention.

In the drawings, like reference numerals are sometimes used to designate like structural elements. It should also be appreciated that the depictions in the figures are diagrammatic and not to scale.

DETAILED DESCRIPTION OF PREFERRED EMBODIMENTS

Figure 1A:
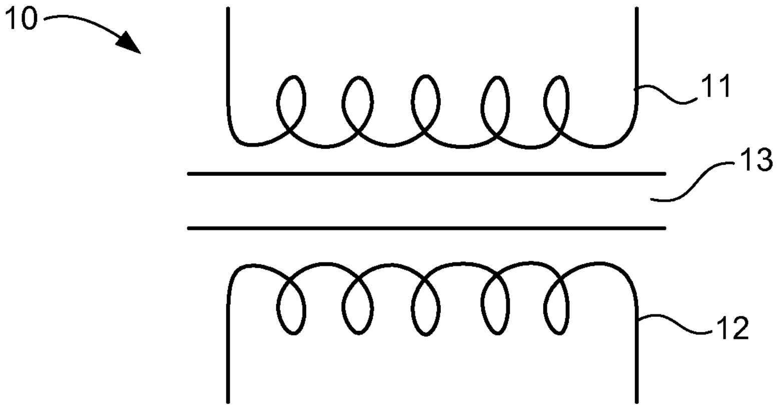
FIG. 1(*a*) is a simplified diagrammatic depiction of a simplified inductor device.
Figure 1B:
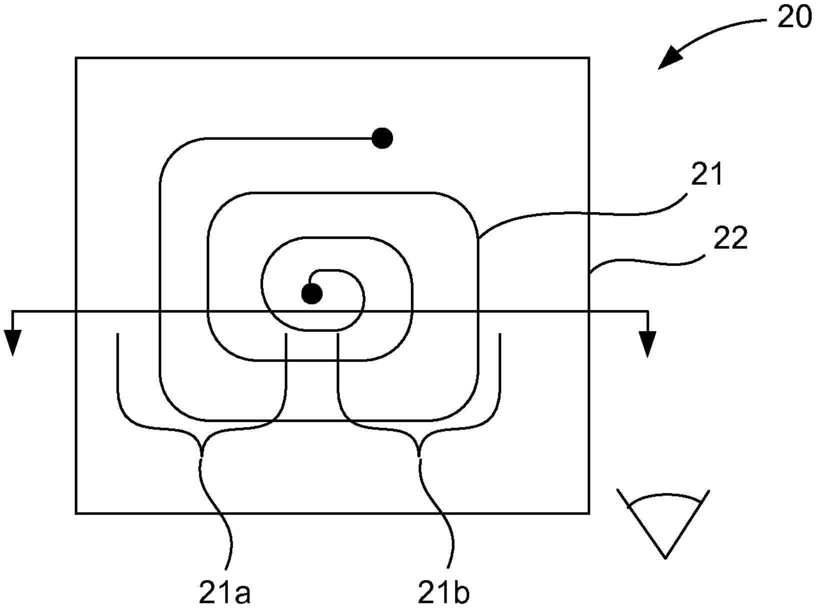
Figure 1C:
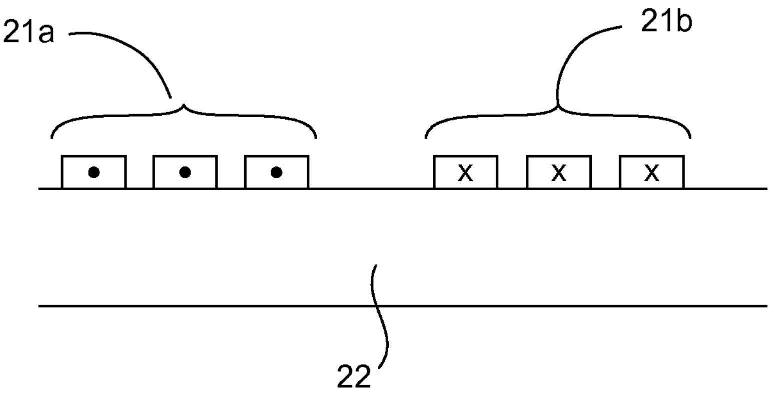
Figure 1D:
Figure 2A:
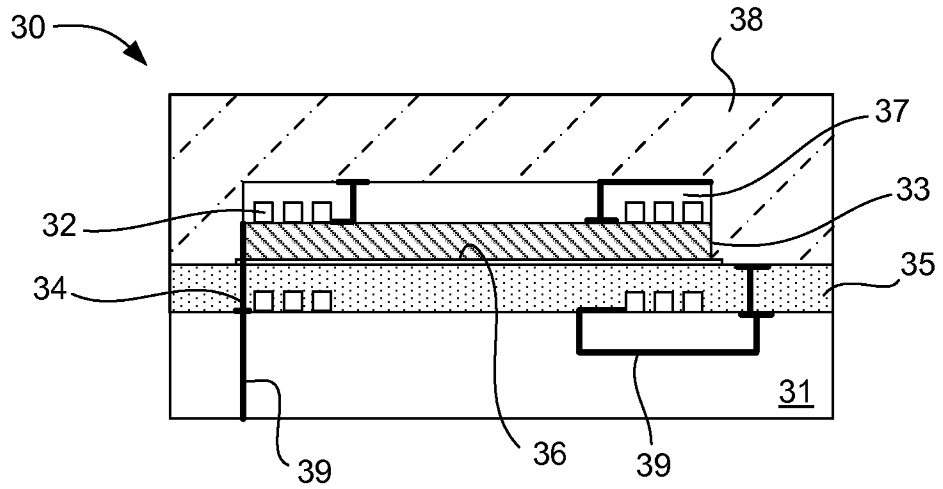
FIG. 2(*a*) is a side section view of a simplified inductor device with enhanced galvanic isolation in accordance with an embodiment of the present invention.
Figure 2B:
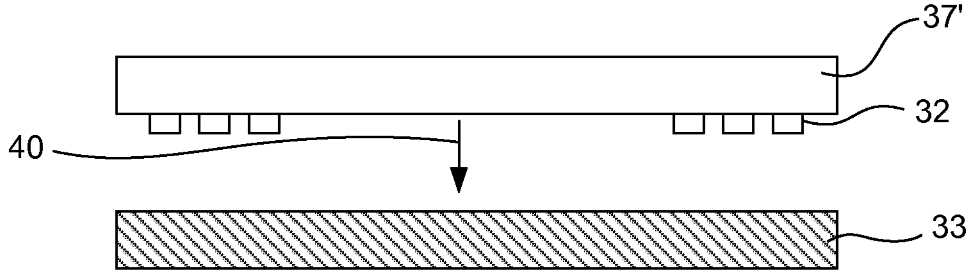
Figure 2C:
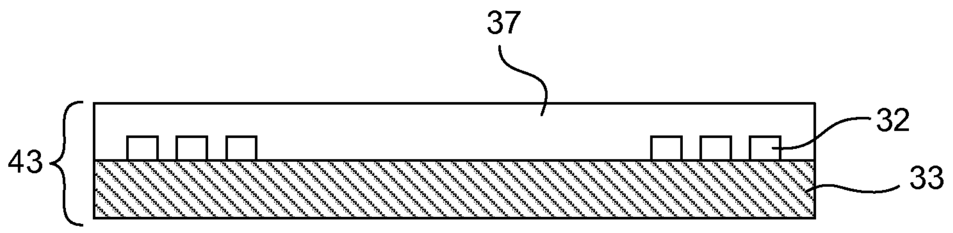
Figure 2D:
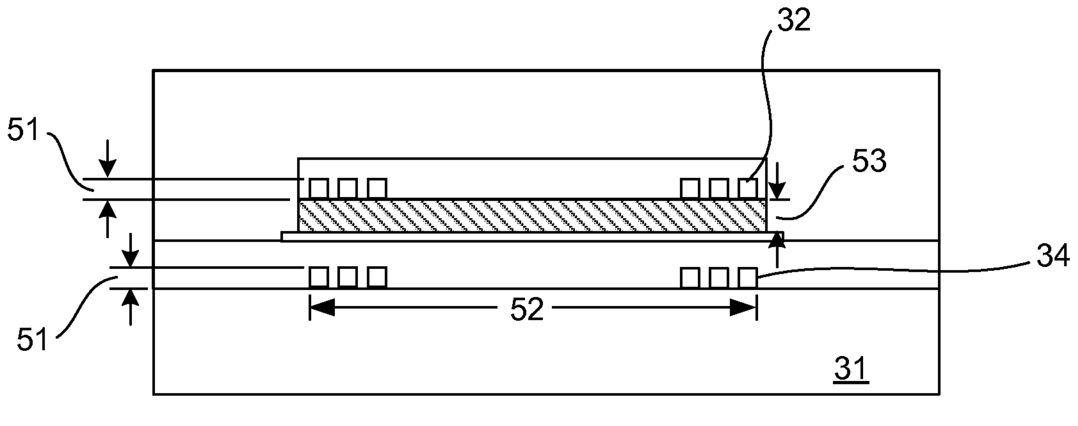

Reference is made to particular embodiments of the invention. Examples of which are illustrated in the accompanying drawings. While the invention will be described in conjunction with particular embodiments, it will be understood that it is not intended to limit the invention to the described embodiments. To contrary, the disclosure is intended to extend to cover alternatives, modifications, and equivalents as may be included within the spirit and scope of the invention as defined by the appended claims.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means both "and" and also, "or", unless stated otherwise. Moreover, the use of the term "including", as well as other forms, such as "includes" and "included", is not limiting and shall be interpreted a having the same meaning as the term "comprising". Also, terms such as "element" or "component" encompass both elements and components comprising one unit and elements and components that comprise more than one unit unless specifically stated otherwise.

Aspects of the invention pertain to novel galvanic isolation substrates as well as the uses to which such substrates can be put. In particular, several different embodiments of inductor devices are disclosed and described herein. Aims of the inventive technologies are to create more robust galvanic isolation structures and resilient associated devices to include inductors and other devices that make use of galvanic isolation material. Additionally, the strength of galvanic isolation material and structures are thinner thereby increasing the inductive (and other) strength of devices using such galvanic isolation structures and materials.

In the simplified diagrammatic illustration of FIG. 1(*a*), a simplified embodiment of an inductor 10 is shown. As depicted in this simplified form, the inductor 10 includes a primary coil 11 and a secondary coil 12 with a space or an isolation structure 13 arranged therebetween. Currently, a common material used for the construction of galvanic isolation structures 13 is a bismaleimide triazine (BT) material. One such type of material is fabricated into pre-preg (pre-impregnated materials) having glass materials (e.g., woven fiberglass materials). Such materials are often used in the construction of PCB boards. In brief, bismaleimide-triazine resins comprise a mixture of bismaleimide and cyanate ester that can polymerize to form a solid and generally resilient material having a high dielectric constant (κ). When coupled with glass fiber, its dielectric constant can be similar or in some cases higher than some silicon dioxide materials. For example, such prepreg BT layers have a galvanic isolation of about 0.1 kV (kilovolts)/μm (micron) rendering it a fairly satisfactory galvanic isolation material. As is known, thicker layers of BT result in higher levels of galvanic isolation. Additionally, BT has some relatively helpful properties that make it easy to work with and relatively inexpensive to process.

First, it can be supplied in easy to work with sheets of epoxy and fiber. Polymerization into a solid substrate is easily facilitated by simple heating processes. It is also fairly rugged. Accordingly, it is an attractive laminate material. Comparatively, silicon dioxide materials are brittle and must be formed on a more rugged carrier. In one case that can be a silicon wafer. It should be pointed out that while silicon dioxide materials can be excellent dielectric materials, the silicon wafers are not. Also, wafers are expensive, as are wafer processing techniques generally. Additionally, such processing forces the construction of silicon dioxide layers that are relatively thin. This thinness reduces the effectiveness of such materials and structures. Worse yet, the silicon wafers upon which they are based contribute relatively little galvanic isolation but substantially increase the distance between the coils, thereby degrading the effectiveness of energy and signal between the coils. Because, in most applications, it is generally advisable to keep the coils as close together as possible, such silicon based substrates are undesirable.

In one application of the present invention, advantageously designed inductors can be made. In one implementation, such inductors employ coil structures. In fact, in one implementation, thin inductive coil structures such as substantially planar spiral coils can be used. Certain types of spiral coils are known in the art.

FIG. 1(*b*) presents a plan view of a simplified spiral coil embodiment 20. Here, the coil 21 can be formed on a substrate 22. In this embodiment of the present invention, the coil 21 can be formed on a BT laminated substrate structure 22.

These coils 21 can be electrically coupled with other electrical elements or devices using interconnects, electrical traces, bond pads, electrical via structures, wire bonds, and a wide range of other electrical connection approaches well known by those of ordinary skill.

FIG. 1(*c*) shows a section view of the embodiment 20. The coil windings (21*a*, 21*b*) are supported on the substrate 22. Many different materials can be used in the formation of suitable substrates 22. It should be pointed out that coil structures can be formed on either, or both, sides of the substrate. In some approaches the substrate can simply be a printed circuit board (PCB).

However, when a laminate substrate is used alone, certain shortcomings are encountered. As mentioned above, such laminates are typically formed using BT materials. It has been noted, that with increasing temperatures, a corresponding degradation of the galvanic isolation properties of such BT substrates 22 is encountered. This causes some unpredictability in the systems as well as other more pronounced and undesirable deleterious effects. With increasing miniaturization of systems, the space between components shrinks, thereby driving system heat up while at the same time placing more stringent requirements on the levels of galvanic isolation of such systems. Another problem is the effect of moisture on such systems. As the level of moisture (for example, in the ambient) rises, the level of galvanic isolation goes down. In one example, a system having a galvanic isolation of 5 kV can drop to 3.5 kV or less.

Also, as mentioned above, temperature related failures can occur in BT. Made worse by the increasing circuit density and processing speeds in modern circuitry. Worse yet, under high heat conditions, a breakdown of galvanic isolation of BT can occur in minutes. Again resulting in system failures, component destruction, as well as other deleterious effects. This breakdown of galvanic isolation must be dealt with, the inventive structures and methods address these problems.

In a very general application, a simple isolation stack 50, without electrical elements attached is depicted in FIG. 1(*d*). To be sure, this is but one embodiment of a wider invention to include, but not limited to, the embodiments described elsewhere in the specification. The depicted isolation stack 50 includes a base support 51 which can be quite thin (e.g., as thin as 4-5 mils) and a galvanic isolation medium 53 adhered together, typically, using an adhesive 55. Electrical elements (for example, coils and capacitor plates) can be arranged on either side of the stack 50.

FIG. 2(*a*) provides a simplified depiction of one embodiment of a device 30 embodying one aspect of the invention. In one generalized implementation, a device 30 in accordance with an embodiment of the invention is described. A pair of coils 32, 34 (or more generally, electrical elements) are arranged above a base support 31. A galvanic isolation medium 33 is arranged between the coils 32, 34. The lower (e.g., primary) coil 34 is associated with a first substrate 35 identified here as an intermediate layer. Additionally, a galvanic isolation medium 33 can be affixed to the first substrate 35 (and coil 34). For example, using an adhesive 36. Above the galvanic isolation medium 33 is arranged an upper (e.g., secondary) coil 32 that is mounted with and/or protected by a second substrate 37 here referred to as a supplemental layer. It is pointed out that embodiments of the invention can form the coil 32 on a surface of the medium 33. The device 30 is further encapsulated with an encapsulant material 38.

In the depicted embodiment, a first electrical element (here coil 34) can be formed on the base support 31 or alternatively on a first substrate 35 (an intermediate substrate). An important feature of the invention is rather, the arrangement of one circuit element (e.g., coil 34) on one side of an isolation medium 33 opposite from a complementary circuit element (e.g., coil 32). Thus, the first circuit element (e.g., 34) and the associated first substrate 35 can be formed on "top of" or, in some embodiments, formed integrally with, the base support 31 and positioned below the galvanic isolation medium 33. And conversely, on the opposite side of the galvanic isolation medium 33 the second circuit element (e.g., 32) can be formed protected by the second layer or substrate 37 (the supplemental layer).

To continue, a base support 31 (which can be a multi-layer laminated structure or a simple single layer BT substrate) with typical embodiments having electrical connections 39 formed therein is formed or provided. Materials for the construction of such electrical connections 39 can include many levels of electrical conduction paths and structures. Such can be configured as multi level striplines, micro strips, or a wide variety of other interconnect configurations. Such multi-level interconnect structures are well known in the art. The electrical connections 39 can be between and to the various electrical elements 32, 34 of the device 30. In addition to the generally described structures 39 above, such electrical connections are intended to be broadly construed to include, without limitation, interconnects, electrical traces, bond pads, electrical via structures, wire bonds, and a wide range of other electrical connection approaches well known by those of ordinary skill As shown and described here, the electrical elements 32, 34 comprise a primary coil 34 and a secondary coil 32 of an inductor device 30 with the first circuit element 34 and a second circuit element 32 both arranged such that the galvanic isolation medium 33 lies between them. It is pointed out that the circuit elements 32, 34 can be any circuit structures that may benefit from the presence of a galvanic isolation medium 33 arranged between them. Examples can include, but are not limited to, capacitor plates, coils, shielding, and so on.

Importantly, as shown here, a coil element (primary coil 34) is arranged on the substrate 35 that can be an integral portion of the base support 31. This coil element 34 can be constructed in many different ways, the invention not being limited to any one of them. In one, non-limiting example, a layer(s) of a conductive foil material can be arranged on a layer of the base support 31 and then material can be selectively removed to define the coil 34 and/or other conductive structures. In one case, a copper foil is arranged upon a pre-preg layer 35 and then etching it to form the coils 34. An advantage to the application of a foil is that the conductive layer can be made rather thick which can provide higher current and less resistance (typical conductive layer thickness of 10 um-70 um). In another approach, the base support 31 or any other mounting substrate 35 can be treated to form a pattern of grooves or recesses in a surface of the base support 31 or other mounting substrate 35. The pattern of the recesses corresponding to the shape of the desired electrical element. For example a recess pattern having a spiral coil shape of a specified depth can be formed. A metal layer can be deposited, sprayed, or otherwise formed on the patterned surface. Then portions of the metal layer can be removed leaving the desired pattern of metal in the recesses. In one example a simple polishing process like CMP can be used to remove the excess material. However, many other methods and materials of metal line formation and, here, coil fabrication are known in the art and can be employed in the embodiments of the invention and the invention is not limited to any specific one of them.

Other such approaches can be include, without limitation, laser cutting to remove desired portions of a foil or other deposited metal layers, selective deposition, silk screen printing an etching, photo engraving, and many other approaches known to persons of ordinary skill in the art. Additionally, many different conductive materials can be used to form the coils 34 (or that of 32) or other electrical elements formed on the substrate 35 or support 31, but one attractive example uses copper materials. For example a copper foil.

Then a galvanic isolation medium 33 is arranged above the primary coil 34 and secured in place. In one implementation, the isolation medium 33 can be secured in place using an adhesive material 36 or other method.

Briefly, the galvanic isolation medium 33 can comprise any material that has a high degree of galvanic isolation. Particularly attractive are materials that possess a high degree of galvanic isolation over a small distance. In one implementation, a borosilicate class (BSG) material can be used. BSG typically has a galvanic isolation of in the range of about 500-700 volts per micron (V/μm). Thus, even a thin layer of BSG, perhaps only 10 μm thick can provide 5 kV or more of galvanic isolation. A 100 μm thick layer can provide 50 kV or more of galvanic isolation and still comprise a very thin layer. BSG is extremely attractive because it is totally non-conductive. Accordingly, there are no eddy currents or other effects that degrade electrical performance. This is very advantageous in inductive and capacitive circuits as well as others. Additionally, as explained elsewhere, BSG is a very rugged and inexpensive material when compared to the alternatives.

It should also be pointed out that other materials or structures can be used as a galvanic isolation medium 33 very thin layer very thin layer in accordance of the principles of the invention. For example, composite materials can be used. Also, in other embodiments, what is critical is the arrangement of a galvanic isolation medium 33 having a relatively high degree of galvanic isolation arranged between a pair of circuit elements 32, 34. With a particular embodiment being an inductor using a pair of coil elements 32, 34. Critical properties of galvanic isolation medium include high dielectric strength, electrically non-conductive, low dielectric constant, no degradation at high temperature and moisture condition.

To continue, a number of methods of securing the galvanic isolation medium 33 with the base support 31 can be employed. In one embodiment, a layer of adhesive material 36 (e.g., an epoxy) can be used to secure the galvanic isolation medium 33. Thus, the galvanic isolation medium 33 is arranged above the primary coil 34 and secured in place. In some embodiments, the galvanic isolation medium 33 can be adhered directly with the primary coil 34 instead of depicted substrate 35. But in such cases the adhesive 36 is a non-conductive adhesive. Alternatively, a layer of adhesive 36 can be applied to a surface of the galvanic isolation medium 33 and then the adhesive treated surface can be affixed above the coil 34 in readiness for further processing.

Further, in one embodiment, a coil 32 is formed on the isolation medium 33. Again, deposition techniques, foil application and etching, or many other techniques can be used to form the coil 32 (or other circuit structure) on medium 33. As can appreciated by those having ordinary skill in the art, other methods of forming such coil can also be used. It should be pointed out that the coil 32 can be formed on a substrate (a prepreg layer for example) and that the substrate/coil combination mounted on the medium 33.

However, here the coil 32 is formed on the galvanic isolation medium 33 and the coil 32 is treated with a layer of material 37 suitable for protecting the patterned coil 32. Such supplemental layer 37 can comprise any non-conductive material. However, in general, a passivation material is preferred. An attractive material is solder mask, due to its common use, and probable use in the fabrication of other aspects of the device 30 as well as the base support 31. Examples include, without limitation, polyimide repassivation materials or alternatives, or even an encapsulant material can be used to protect the coil 34.

One type of attractive materials comprises solder mask materials, due to their common use and probable use in the fabrication of other aspects of the base support 31 more generally. Thus, the supplemental layer 37 provides a degree of protection and electrical insulation to the coil 32. It is pointed out that using a pre-preg-substrate as a supplemental layer 37 is contemplated. The details, materials, or presence of an intermediate layer 35 are not critical to the practice of the invention, but are rather a convenient example.

It is worth pointing out that although disclosed with respect to an inductor element using coils, another configuration, where the elements 32, 34 each comprise the complementary plates of a capacitor device is also contemplated. As are a number of other devices requiring a degree of galvanic isolation between circuit elements.

In the formation of such devices 30, in one advantageous approach, the galvanic isolation layer can be processed separately before attachment to the base 31.

As disclosed above, in one approach, a coil 32 can be formed on the galvanic isolation medium 33 and then treated to form a passivation layer 37 that protects the coil 32. Alternatively, in another possible approach FIG. 2(*b*) illustrates an approach where the coil 32 is mounted with a base 37' and then mounted with the galvanic isolation medium 33. For example, a substrate 37' is patterned to form a coil 32 on a surface, as well as desired electrical connections, traces, bond pads and the like to form a patterned supplemental substrate. This patterned BT prepreg sheet 37' is then moved 40 into position on to the galvanic isolation medium 33. It can then be combined to form a substrate 43 galvanic isolation medium 33 with coil 32 sealed with the prepreg 37' (as shown in FIG. 2(*c*)). Alternatively, a series of pre-preg layers 37' each having at least one coil patterned thereon can be stacked on the isolation medium 33 and onto the rest of the base 31 and a stack of other substrates (e.g., 35) and associated coils (e.g., 34) and then the entirety of the base 31, galvanic isolation medium 33, adhesive layer 36, prepreg 37, and coils 32, 34 are heated and compressed together to form an integrated whole that can be encapsulated and packaged as desired.

Many different dimensions and sizes for such embodiments can be used, but some example ranges are included here for reference. It is specifically pointed out that the invention is not limited to these ranges.

With reference to FIG. 2(*d*), a laminate substrate can have any thickness selected by the designer. The coil line thicknesses and heights can be chosen also at the liberty of the designer. The width 52 of the coil structures 32, 34 is determined by the number of windings and needs on the system. Commonly such coil widths are on the order of about 2-10 mm but both larger and smaller coil diameters are contemplated. Additionally, coil heights 51 are a trade-off between inductance needed, current carrying needs, resistance, and fabrication concerns (as well as others). Commonly such coil heights 51 are on the order of about 9 μm to about 70 μm, but typically ranges from about 12 μm to about 35 μm, but can be thicker or thinner. Thicker, taller, coils have higher current throughput and less resistance with thinner coils being easier to etch and pattern.

Additionally, the height 53 of the galvanic isolation layer 33 is generally determined by the level of galvanic isolation needed and the material used. In one example, a BSG a galvanic isolation layer 33 may have a thickness 53 in the range of about 10 μm to 100 μm (from 5 kV to about 50 kV) or thicker depending on the degree of galvanic isolation desired.

Figure 3A:
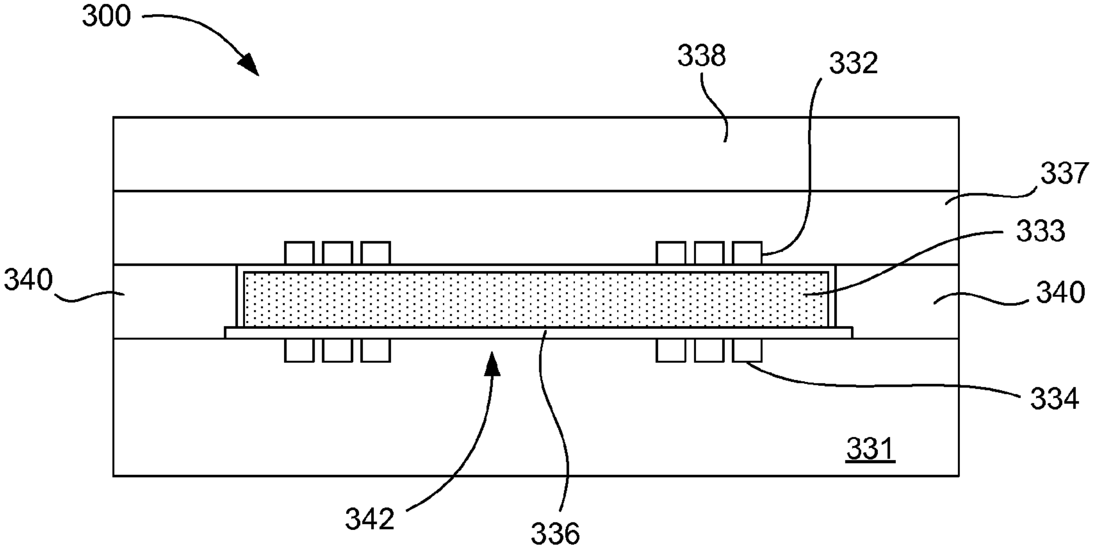
FIG. 3(*a*) is a side section view of a simplified inductor device with an embedded galvanic isolation medium in accordance with an embodiment of the present invention.
Figure 3B:
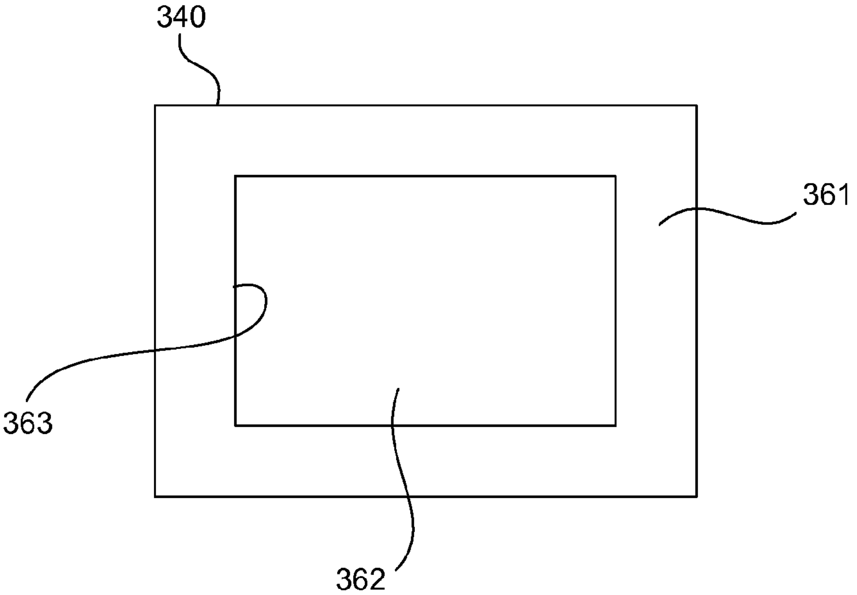
Figure 3C:
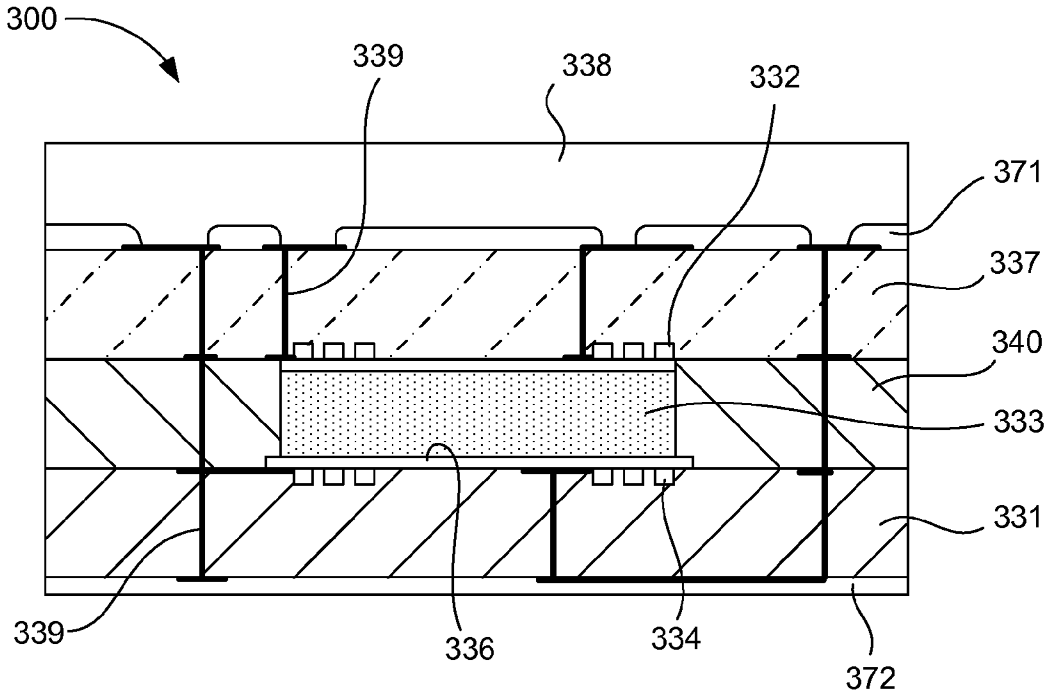

In another device embodiment, an embedded galvanic isolation structure 300 is described. FIG. 3(*a*) provides a simplified depiction of one embodiment of the invention describing a device 300 having an embedded isolation medium.

As generally described the embedded galvanic isolation structure 300 includes a first circuit element 334 and a second circuit element 332 arranged such that a galvanic isolation medium 333 lies between the two circuit elements 332, 334. In this embodiment, the first circuit element 334 (e.g., a coil) is formed on the base 331 and the second circuit element 332 (e.g., a coil) is formed on the substrate 337 (supplemental layer) arranged above the isolation medium 333. Additionally, between the base support 331 and substrate 337 lies a spacer element 340 arranged to keep the base support 331 and the substrate 337 arranged in a spaced apart configuration and define an open region 341 that exposes an attachment region 342 within the confines of the spacer 340 such that a galvanic isolation medium 333 can be mounted in an attachment region 342. Thereby, enabling the galvanic isolation medium 333 to be adhered 336 to the attachment region 342 of the base support 331.

Accordingly, such a device includes a base support 331 of a type such as described above. For example, as above, a laminated substrate 331 can comprise many layers of BT to form a multi-layer laminate structure. The substrate 331 typically includes many levels of conductive interconnect structures as above. Such can be configured as wide variety of stacks and interconnect configurations.

A coil 334 can then be formed thereon. In one embodiment, the coil 334 can be formed on an upper surface of the base support 331. Or the coil 334 can be formed on a substrate that will be mounted on the base support 331. For example, as described above a pre-preg substrate can be used. In some processes that substrate will simply become an upper layer of the support 331. In the depicted implementation, one of the pre-preg layers of the base 331 can be heated and compressed to mount the coil 334 in place. Alternatively, the coil 334 can be formed on top of an already formed base support 331 and a first substrate (e.g., as with 37, the intermediate layer as formed as in FIGS. 1(*a*)-1(*d*)). Of course other approaches can be used as well.

A spacer element 340 is arranged on the base 331 defining therein an attachment region 342 where a galvanic isolation medium 333 can be mounted. In one implementation, the spacer element 340 can merely be a pair of spaced raised features that provide a support for an overlying substrate 337 (supplemental layer) and expose the attachment surface 342.

Alternatively and in more preferred approach, as shown in plan view in FIG. 3(*b*), a spacer element 340 can include a wall 361 having an inner aperture 362 formed therein. An inner wall surface 363 of the aperture 362 circumscribes a mounting site into which a galvanic isolation medium 333 is to be fitted. The inner surface 363 of the aperture 362, when mounted on the base support 331 circumscribes an attachment region 342 (as shown in FIG. 3(*a*)) of the base support 331. In this embodiment, the galvanic isolation medium 333 is adhered to the base 331, in the attachment region 342 defined by the aperture 362 of the spacer 340. Commonly, adhesives 336 of the types already described can be used.

Such a spacer 340 can be formed of a number of different materials, sizes and methods. In one implementation the spacer 340 is formed of BT materials. It should be formed so that the galvanic isolation medium 333 fits within the bounds defined by the spacer 340 and that the spacer is tall enough so that it keeps the coils 332, 334 are at the desired distance from each other. The spacer 340 can be formed by molding, laser cutting a substrate to a desired shape, selective deposition, etching, and many other approaches known to persons of ordinary skill in the art.

Returning to a discussion of FIG. 3(*a*), as before, the circuit elements 332, 334 are not limited to just coils. Any circuit structures that may benefit from the presence of a galvanic isolation medium 333 arranged between them can benefit from these inventions.

To continue, a primary coil 334 is arranged and fabricated on the base support 331. As before, this coil can be constructed in many different ways with one method including, a layer of pre-preg processed to include a conductive coil structure which can be arranged on the base support 331 and heated and compressed to form an upper part of the base support 331.

In one embodiment, a layer of adhesive 336 is positioned on the attachment region 342 of the base support 331. The spacer 340 is positioned on the base support 331 such that an inner wall 363 of a spacer aperture 362 circumscribes and exposes the attachment region 342 (and the adhesive layer 336 situated therein). The galvanic isolation medium 333 is positioned therein. The substrate 337 and secondary coil 332 are then arranged on the spacer such that the coil 332 rests over the galvanic isolation medium 333. This structure can be heated and compressed, either in whole or in part, to create a whole device which can be encapsulated with an encapsulant material 338.

FIG. 3(*c*) depicts a side section view of one embodiment of an inductor device 300 using an embedded galvanic isolation medium as taught in some embodiments of the invention. This drawing illustrates some particularly relevant details. The device 300 is an embedded galvanic isolation medium device. A base support 331 is shown including an array of electrical connections 339. Additionally, the base 331 includes an inductor coil 334. A spacer 340 is mounted on the base 331 as is layer of adhesive 336. In this embodiment, an inner wall circumscribes an opening of the spacer 340 defines a mounting site for the galvanic isolation medium 333. The medium 333 is positioned on the adhesive 336 in the opening. A complementary coil 337 and second substrate 337 are arranged on the spacer 340 thereby arranging the spacer 340 (and isolation medium 333) such that it lies between the two coils 332, 334. It should be pointed out that in some embodiments the space inside the spacer 340, intermediate layer 337, and base support 331 can optionally be filled with a dielectric, an epoxy, encapsulant, as well as in some possible implementations, a pre-preg material, as well as other materials such that all the interstitial space between the galvanic isolation medium 333 and the adjacent structure are filled. Also, the spacer 340 itself can encompass structure (e.g., a pair of end posts) that merely hold the members 337, 331 in a spaced apart arrangement such that the galvanic isolation medium 333 can be mounted between the elements 332, 334. The upper portion of the member 337 can be treated with a layer 371 that protects the upper surface of the intermediate member 337 and exposes the desired pads and electrical connections 339. A coating material can be used in the layer 371. A protective covering is placed at a bottom surface of the device 300. And a protective encapsulant 338 is placed at an upper surface of the device 300.

Figure 4:
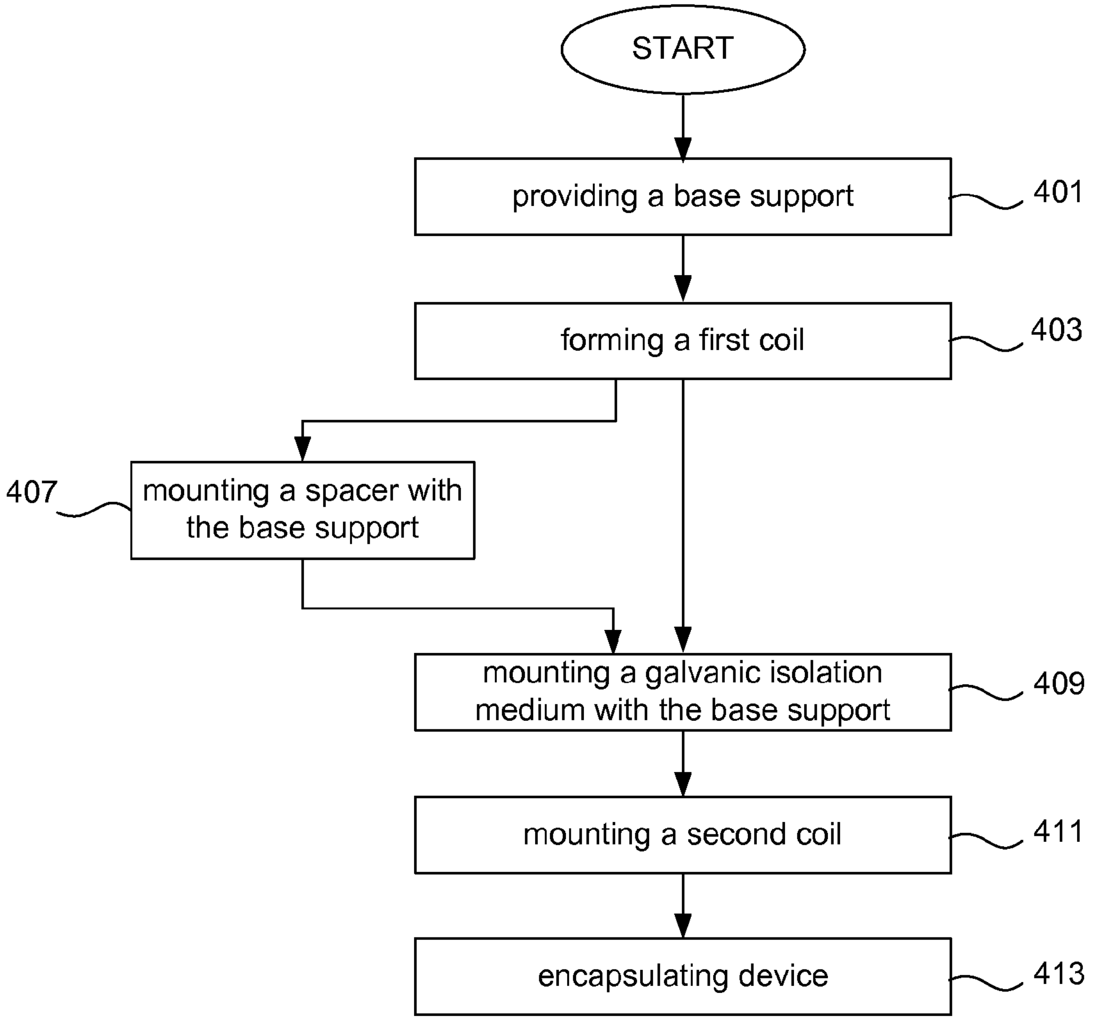
FIG. 4 is a flow diagram illustration one approach for fabricating a device in accord with an embodiment of the device.
Figure 5A:
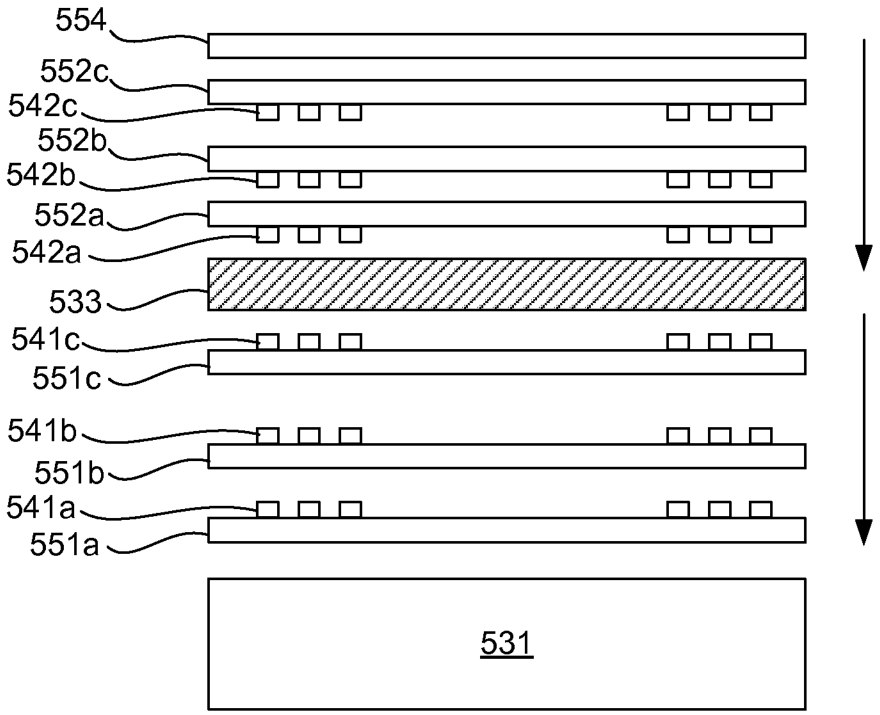
FIGS. 5(*a*)-5(*d*) are a set of drawings that illustrate two embodiments of a multi-coil or shielded inductor device in accordance with an embodiment of the invention.
Figure 5B:
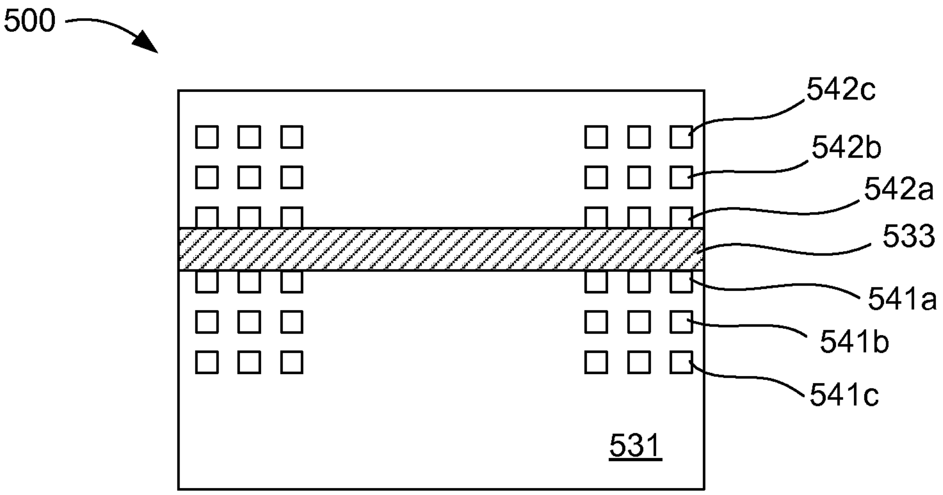
Figure 5C:
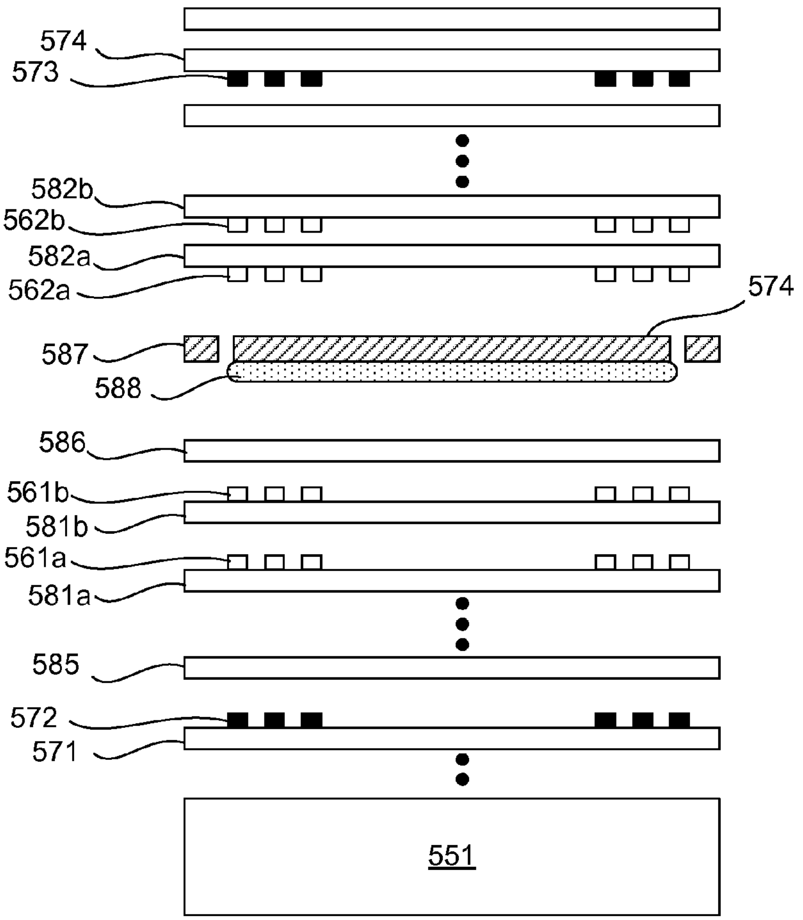
Figure 5D:
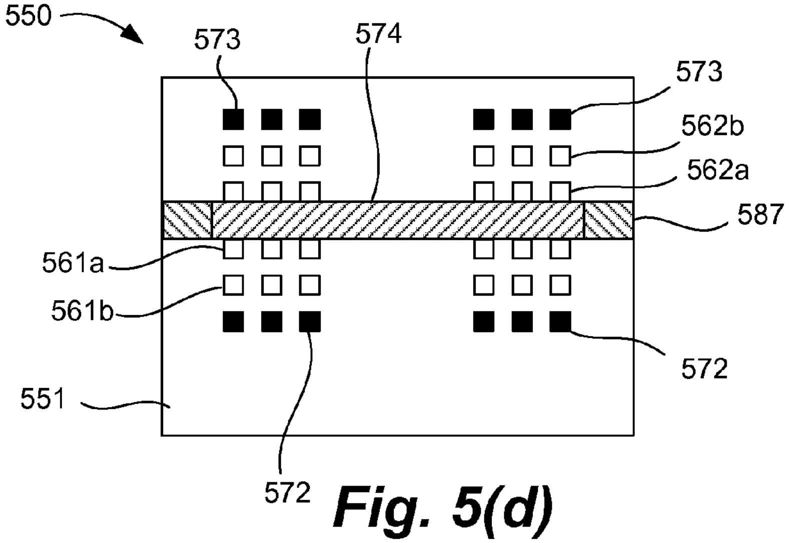

One method of constructing such devices is described with reference to the flow diagram of FIG. 4. It is specifically noted that the operations disclosed herein can be performed in many different orders and combinations and merely disclose one embodiment of the inventive methodologies.

In a first operation (Step 401), a base support is formed. As disclosed above, it can take many configurations and include any layers and interconnect patterns as well as other parameters.

In another operation (Step 403), a first electrical element (e.g., a primary inductor coil 34, 334, etc.) is formed. In one example, such a structure can be formed on a surface of a base support (e.g., 31, 331), heated, and subject to pressure to secure the first electrical element. It is pointed out here, that all or many of the heating and pressure operations can be performed at one time, or in groups of operations, or one at a time. Such an element can be formed using any of the methods described above as well as others.

In further discussion of Steps 401 and 403, it is pointed out that in a related approach, several stacks of supporting substrates can have desired circuit elements formed on them (e.g., coils, shielding elements, or other electrical circuitry). These can then be stacked, one at a time, or all at once, or in small groups, and then subject pressure and heat to for a stacked multilayer structure. In this case, a multilayer base support with several layers of such circuit elements. It should be pointed out that intervening layer can also be stacked between the circuit elements providing electrical insulation between elements as well as forming electrical connections between them. BT and pre-preg materials are well suited to forming these stacked layers and intervening layers.

In one embodiment for forming an embedded galvanic isolation medium, another operation (Step 407) comprises mounting a spacer element 340 such that a galvanic isolation medium can be placed in an attachment region 342 defined by the spacer 340. Such as described elsewhere in this disclosure.

In another operation (Step 409), a galvanic isolation medium (e.g., 33, 333) is mounted with the device where can be secured by adhesive (e.g., 36, 336) or other modes of attachment. The structure can then be heated, and subject to pressure to secure the galvanic isolation medium in place. In one embodiment, the galvanic isolation medium (e.g., 333) is mounted within an attachment region 342 defined by the spacer 340. Alternatively, a galvanic isolation device (e.g., 33) is mounted (e.g., to the base 31) and secured by adhesive (36) or other modes of attachment.

In another operation (Step 411), a second electrical element (e.g., a secondary inductor coil 32, 332, etc.) is formed and mounted. As before, such a coil structure can be formed on the galvanic isolation medium and then sealed with a protective layer. Alternatively, the coil can be formed as part of an intermediate structure (e.g., layer (37', 337) such as a BT substrate. In the case of such a substrate 37', a process of heating under pressure secures the second coil (or other electrical element) in place. It is pointed out here, that all or many of the heating and pressure operations of the process can performed at one time, or in groups of operations, or all at one at a time.

Here, with respect to Step 411 it is pointed out that in a related approach, several stacks of supporting substrates can have desired circuit elements formed on them (e.g., coils, shielding elements, or other electrical circuitry). These can then be stacked, one at a time, or all at once, or in small groups, and then subject pressure and heat to for a stacked multilayer structure. In this case, a multilayer base support with several layers of such circuit elements. It should be pointed out that intervening layers can also be stacked between the circuit elements providing electrical insulation between elements as well as forming electrical connections between them. BT and pre-preg materials are well suited to forming these stacked layers and intervening layers. Examples of such implementations are described later with reference to, for example, FIGS. 5(*a*)-5(*d*).

In another operation (Step 413), the assembled structure can be treated with protective layers (e.g., 371, 372, and so on) and encapsulants (e.g., 338) to form completed devices like inductors.

Additionally, such devices can be formed in masses of individually formed devices. Also, mass arrays of such devices are formed and encapsulated and then singulated to form the completed devices or formed as separate devices.

FIGS. 5(*a*)-5(*d*) describe a number of approaches and embodiments that can be used to construct multi-layer device embodiments including, but not limited to, multi-coil inductors, shielded conductors, and many other types of devices that can use the enhanced galvanic isolation properties of the present invention.

With reference to FIGS. 5(*a*) and 5(*b*), the disclosure teaches a multi-coil inductor device 500 embodying one aspect of the invention. In this simplified illustration, a base support 531 supports a first set of electrical elements (here coils 541*a*, 541*b*, 541*c*) and a second set of electrical elements (here coils 542*a*, 542*b*, 542*c*) in a spaced apart relationship such that a galvanic isolation medium 533 is arranged between the coils.

In constructing such a device, a first set of coils (e.g., here lower coils 541*a*, 541*b*, 541*c*) is formed on an associated set of substrates (substrates 551*a*, 551*b*, 551*c*). Such substrates can be formed of such easily workable materials such as BT or resin impregnated glass layers (e.g., pre-preg layers). Additionally, the various layers and device as a whole can be interlaced with electrical interconnection structures. It should also be pointed out that although heating and pressure can be used to form and unify the final device. Layers of adhesive can optionally be employed.

Additionally, a second set of coils (e.g., here upper coils 542*a*, 542*b*, 542*c*) is formed above the galvanic isolation medium 533. In forming such a second set of coils, one type of process can comprise forming in a recursive process an initial coil 542*a* (e.g., on the isolation medium 533), depositing an initial dielectric layer on the initial coil 542*a*, forming a next coil 542*b* on the initial dielectric layer, then forming a next passivation layer over the next coil 542*b*, forming another coil 542*c* and passivation layer and so on.

In another approach, as shown here, a slightly different approach can be taken using a series of substrates instead of passivation layers. Accordingly, on an associated set of substrates (substrates 552*a*, 552*b*, 552*c*) can be formed the second set of coils (e.g., here upper coils 542*a*, 542*b*, 542*c*). Such substrates (552*a*, 552*b*, 552*c*) can be formed of such easily workable materials such as BT or resin impregnated glass layers (e.g., pre-preg layers). Additionally, the various layers and device as a whole can be interlaced with electrical interconnection structures. It should also be pointed out that although heating and pressure can be used to form and unify the final device. Layers of adhesive can optionally be employed.

Additionally, it is pointed out that a number of optional intermediate layers of substrate 554 can be used to increase distance or electrical isolation between the various elements of the device 500. As mentioned above, the elements of the device can be stacked and heated under pressure to unify the whole structure in a device analogous to the simplified device

500 shown in FIG. 5(*b*). These devices can include encapsulant and protective layers as described elsewhere as well.

Importantly, a galvanic isolation layer 533 is arranged between the two sets of coils set 1 (e.g., coils 541*a*, 541*b*, 541*c*) and set 2 (e.g., coils 542*a*, 542*b*, 542*c*). Such a galvanic isolation medium 533 can be arranged and formed similarly to that of the spacerless implementation of FIGS. 2(*a*)-2(*d*) or alternatively a similar and analogous structure can also be formed in a device using an embedded galvanic isolation medium (e.g., such as the embodiments of FIGS. 3(*a*)-3(*c*)).

With reference to FIGS. 5(*c*) and 5(*d*), the disclosure teaches an inductor featuring shielding that can be readily and easily be installed in simple single coil device and/or multi-coil inductor device 550 embodying in some aspects of the invention. In this simplified illustration, a base support 551 supports a first set of electrical elements (here, e.g., coils 561*a*, 561*b*) and a first associated shield structure 572 and also a second set of electrical elements (here coils 562*a*, 562*b*) and a second associated shield structure 573. The arrangement is such that a galvanic isolation medium 574 is arranged between the sets of coils. Also, the coils are arranged so each respective set of coils is arranged between an associated shield element and the isolation medium 574. For example, as shown here, the second set of coils (562*a*, 562*b*) is arranged between the shielding layer 573 and the isolation medium 574. It is pointed out that the shielding layers 572, 573 can comprise any structure suitable for the reduction of electro-magnetic field effects (emf) generated by the coils and also to shield the coils from outside emf effects.

As above, a first set of coils (lower coils 561*a*, 561*b*) are arranged on an associated set of substrates (coils 581*a*, 581*b*). A similar second set of coils (upper coils 562*a*, 562*b*) are arranged above the isolation member 574. As with the embodiment described with respect to FIGS. 5(*a*)-5(*b*), this second set of coils (562*a*, 562*b*) can be formed on alternating layers of dielectric materials. Alternatively, the second set of coils (upper coils 562*a*, 562*b*) can be formed on an associated set of substrates (coils 582*a*, 582*b*).

Also, a first shield 572 can be formed directly on the base 551 or a substrate 571 which is mounted with the substrate 551. This shield 572 has the associated first set of coils (561*a*, 561*b*) formed above it.

Also a second shield (upper shield 573) can be formed on a layer of passivation (or other) material formed above the upper coil (here 562*b*). Alternatively, in one embodiment, the second shield (upper shield 573) can be formed by mounting with a substrate (e.g., 574) where the combination is mounted above the upper coil (here 562*b*). As before, such substrates can be formed of such easily workable materials such as BT or resin impregnated glass layers (e.g., pre-preg layers) which can also be interlaced with electrical interconnection structures.

Additionally, it is pointed out that any number of intermediate layers of substrate 585, 586 can be used to increase distance, or electrical isolation between the various elements of the device 550 or simply to aid in the fabrication of the device 550. As mentioned above, the elements of the device can be stacked and heated under pressure to unify the whole structure in a device analogous to the simplified device 550 shown in FIG. 5(*d*). It should also be pointed out that although heating and pressure can be used to form and unify the final device. Layers of adhesive can optionally be employed.

Importantly, as indicated above, the galvanic isolation layer 574 is arranged between the two sets of coils and shields. Such a galvanic isolation medium 574 can be mounted within a confine defined by a spacer element 587 which can be arranged and formed similarly to that of the implementation of FIGS. 3(*a*)-3(*c*). In one implementation, a layer 588 of adhesive can simply be applied to one of a surface of the galvanic isolation medium 574 or a surface of the base support 551. For example a heat curable epoxy can be used. Also, as indicated previously, spacerless implementations can be used with such shielded inductor device.

Figure 6:
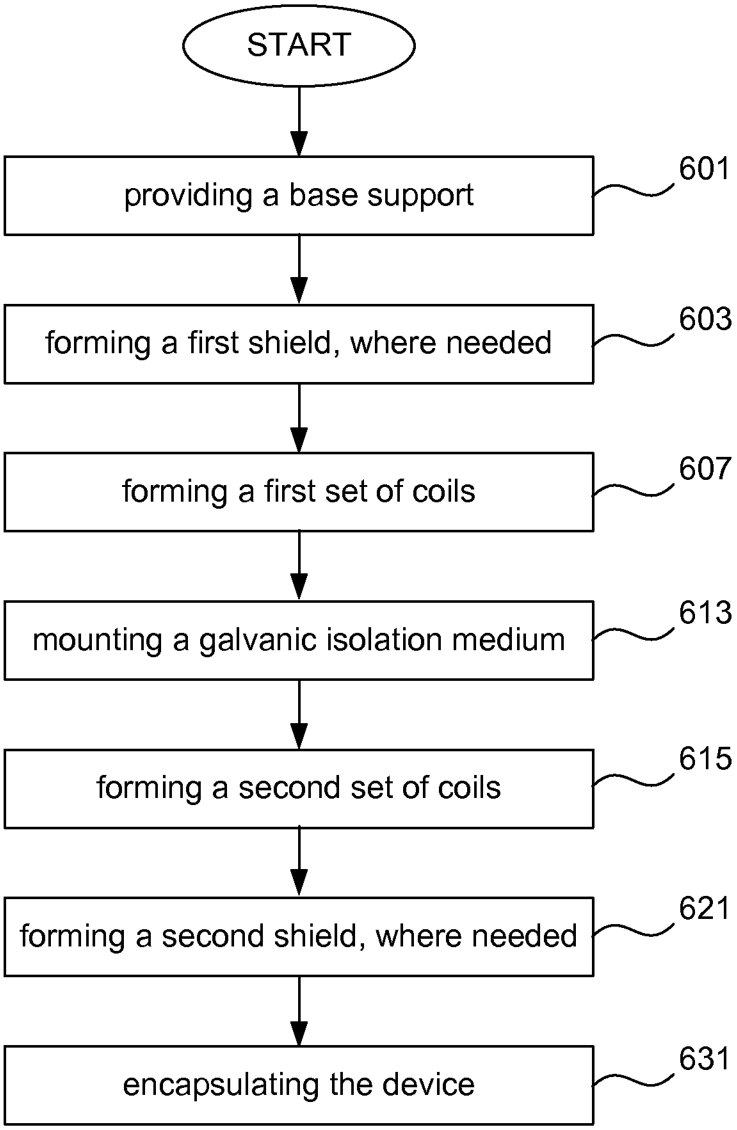
FIG. 6 is a flow diagram that illustrates a process embodiment for forming a multi-coil or shielded inductor device in accordance with an embodiment of the present invention.

One method of constructing such multiple coil and/or shielded inductor devices is described with reference to the flow diagram of FIG. 6. It is specifically noted that the operations disclosed herein can be performed in many different orders and combinations and merely disclose one embodiment of the inventive methodologies.

In a first operation (Step 601), a base support is provided (e.g., 531, 551). As disclosed above, it can take many configurations and include many layers and interconnect patterns as well as other parameters.

In another operation (Step 603), wherein at least one first shield element (e.g., 572) is to be used, a first shield element 572 can be formed on a surface of a base support (e.g., 531, 551), heated, and subject to pressure to secure the first electrical element. Alternatively, it can be on a surface of the associated substrate 571 which can be affixed to the base support (e.g., 531, 551).

In another operation (Step 607), a first set of electrical elements (e.g., inductor coils such as 561*a*, 561*b*) are formed. In one example, a plurality of coil elements can each be mounted with associated substrates and then mounted one after another until a desired number of coil elements are formed and arranged to complete a first set of coils. In one example, such coils (561*a*, 561*b*) can be formed on surfaces of associated substrate(s) (e.g., 581*a*, 581*b*), heated, and subject to pressure to secure the first electrical element. It is pointed out here that the substrate can be all stacked and processed together or that the heating and pressure operations can be performed one at a time, or in groups of operations. These coils can be formed above the first shield (e.g., 572) or where a shield is not used on a bases support (531, 551). It should be pointed out that in the process of forming these structures additional substrate layers (585, 586) can be formed at various stages to protect the various shield and coil elements or to set spacing or to address manufacturability issues.

In another operation (Step 613), a galvanic isolation medium (533, 574) is mounted to the portion of the device already assembled. In one example, the galvanic isolation medium is secured by adhesive or other mode of attachment. In one embodiment, for forming an embedded galvanic isolation medium, the operation comprises mounting a spacer element 587 such that a galvanic isolation medium can be placed in an attachment region defined by the spacer such as described elsewhere in this disclosure.

In another operation (Step 615), a second set of at least one coil (562*a*, 562*b*) are formed above the galvanic isolation medium (533, 574). As indicated above, such can be mounted using alternating structures of a coil, then passivation layer, then another coil, and another passivation layer and so on until a desired number of coils are formed to complete a second set of coils. For example, with respect to FIG. 5(*c*) a second set of substrates 582*a*, 582*b*, can have respective coils 562*a*, 562*b*, formed thereon. Such coils are then formed and mounted above the galvanic isolation medium (533, 574).

In another operation (Step 621), wherein at least one second shield element (e.g., 573) is to be used, the shield element 573 is formed above the second set of coils (562*a*, 562*b*). In one embodiment a dielectric layer is formed above an uppermost coil (562*b*) and then the shield 573 is formed. In another approach the shield 573 can be mounted with an associated substrate 574 and then mounted on the device 550.

In another operation (Step 631), the assembled structure can be treated with protective and/or encapsulant layers to form completed devices like inductors.

Additionally, such devices can be formed in masses of individually formed devices. Also, mass arrays of such devices are formed and encapsulated and then singulated to form the completed devices or formed as separate devices.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description and to illustrate practical applications of the inventions, to thereby enable others skilled in the art to best utilize the invention and various embodiments with various modifications as are suited to the particular use contemplated. They are not intended to be exhaustive or to limit the invention to the precise forms disclosed. It will be apparent to one of ordinary skill in the art that many modifications and variations are possible in view of the above teachings. Additionally, various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

What is claimed is:

1. A galvanic isolation stack having improved galvanic isolation properties, the substrate comprising:

a base support;

a galvanic isolation medium arranged above the base support and the galvanic isolation medium having a high dielectric strength;

wherein the galvanic isolation stack comprises a device comprising a first electrical element and a second electrical element arranged such that the galvanic isolation medium is arranged between the first electrical element and the second electrical element;

wherein the galvanic isolation material is a borosilicate glass material; and wherein the first electrical element comprises a first coil element and the second electrical element comprises a second coil element arranged such that the device comprise an inductor device;

wherein the galvanic isolation medium is adhered in place using an adhesive material;

wherein the stack further comprises, a first shielding element and a second shielding element, and wherein the first coil element is arranged between the first shielding element and the galvanic isolation medium; and wherein the second coil element is arranged between the second shielding element and the galvanic isolation medium.

2. The galvanic isolation stack of claim 1 wherein the galvanic isolation medium comprises a single material.

3. The galvanic isolation stack of claim 1 wherein the galvanic isolation medium comprises a laminate of more than one material.

4. The galvanic isolation stack of claim 1 wherein the stack comprises a third coil element arranged above the first coil element and further comprises a fourth coil element arranged below the second coil element.

5. The galvanic isolation stack of claim 1 wherein the stack further comprises an embedded galvanic isolation medium wherein, the second coil is arranged on a supplementary substrate;

the galvanic isolation layer is arranged below the supplementary substrate;

the base support includes an attachment region and the first coil is arranged on the base support;

a spacer element arranged between the base support and the supplementary substrate and configured such that the first coil and the second coil are maintained in a spaced apart arrangement and such that the spacer circumscribes the attachment region of base support that exposes the attachment region; and the galvanic isolation medium arranged in the attachment region of the first galvanic isolation structure.

6. The galvanic isolation stack of claim 5 further comprises a third coil element arranged above the first coil element and further comprises a fourth coil element arranged below the second coil element.

7. The galvanic isolation stack of claim 5 wherein the galvanic medium is adhered in place using an adhesive material.

8. The galvanic isolation stack of claim 5 wherein the embedded structure further comprises, a first shielding element and a second shielding element, and wherein the first coil element is arranged between the first shielding element and the galvanic isolation medium; and wherein the second coil element is arranged between the second shielding element and the galvanic isolation medium.

9. The galvanic isolation stack of claim 1, wherein the galvanic isolation substrate comprises a device wherein the first electrical circuit element and the second electrical circuit element comprise one of at least one of an inductive circuit element and a capacitive circuit element.

10. A method for forming an apparatus comprising a galvanic isolation stack having galvanic isolation properties, the method comprising:

providing a base support;

arranging a galvanic isolation medium above the base, the galvanic isolation medium comprising borosilicate glass material;

forming a first electrical circuit element and a second electrical circuit element arranged such that the galvanic isolation medium is arranged between the first electrical circuit element and the second electrical circuit element;

wherein, the first electrical circuit element comprises first coil element arranged above the galvanic isolation medium; and the second circuit element comprises a second coil element arranged below the galvanic isolation medium thereby forming an inductor wherein the apparatus comprises an inductor device, and wherein the first electrical element comprises a primary coil of the inductor and the second electrical element comprises a secondary coil of the inductor, further comprising; forming a first shielding element such that the first coil element is arranged between the first shielding the element and the galvanic isolation medium; and forming a second shielding element such that the secondary coil element is arranged between the second shielding element and the galvanic isolation medium.

11. The method of claim 10 further comprising, arranging a third coil element above the first coil element; and arranging a fourth coil element below the second coil element.

12. The method of claim 10 wherein said arranging of the galvanic isolation medium above the base support includes affixing it in place using adhesive.

13. The method of claim 10 wherein the galvanic isolation substrate comprises forming an embedded structure further comprising, arranging a supplementary substrate above the galvanic isolation medium such that the galvanic isolation medium is arranged between the supplementary substrate and the base support;

and arranging the first coil in the supplementary substrate.

14. The method of claim 13 wherein, the base support includes an attachment region, and arranging a spacer element so that it lies between the base support and the supplementary substrate and wherein the attachment region lies within a space defined by the spacer and wherein the galvanic isolation medium is mounted with the attachment region of the base support.

15. The method of claim 13 wherein the spacer;

includes an inner aperture arranged such that the inner aperture circumscribes at least a portion of the attachment region of the base support; and wherein the arranging of the spacer is conducted such that the galvanic isolation medium is arranged within the inner aperture of the spacer and between the base support and the first supplementary substrate.

* * * * *